United States Patent
Hansson et al.

(10) Patent No.: US 9,516,414 B2
(45) Date of Patent: Dec. 6, 2016

(54) COMMUNICATION DEVICE AND METHOD FOR ADAPTING TO AUDIO ACCESSORIES

(71) Applicant: BlackBerry Limited, Waterloo (CA)

(72) Inventors: Per Magnus Fredrik Hansson, Waterloo (CA); Craig Eric Ranta, Kitchener (CA); Mohamad El-Hage, Cambridge (CA)

(73) Assignee: BLACKBERRY LIMITED, Waterloo, Ontario (CA)

( * ) Notice: Subject to any disclaimer, the term of this patent is extended or adjusted under 35 U.S.C. 154(b) by 142 days.

(21) Appl. No.: 14/326,882

(22) Filed: Jul. 9, 2014

(65) Prior Publication Data
US 2016/0014509 A1    Jan. 14, 2016

(51) Int. Cl.
*H03G 5/00* (2006.01)
*H04R 3/04* (2006.01)
*H04M 1/60* (2006.01)
*H03G 5/16* (2006.01)
*H04M 1/725* (2006.01)

(52) U.S. Cl.
CPC .......... *H04R 3/04* (2013.01); *H04M 1/6058* (2013.01); *H03G 5/165* (2013.01); *H04M 1/72527* (2013.01); *H04R 2410/00* (2013.01); *H04R 2420/07* (2013.01)

(58) Field of Classification Search
None
See application file for complete search history.

(56) References Cited

U.S. PATENT DOCUMENTS

| 7,907,741 | B2 | 3/2011 | Gyotoku | |
| 2008/0159561 | A1* | 7/2008 | Parker et al. | G06F 9/4418 381/94.5 |
| 2011/0194713 | A1 | 8/2011 | Apfel et al. | |
| 2013/0044901 | A1* | 2/2013 | Dong et al. | H04R 3/005 381/122 |

FOREIGN PATENT DOCUMENTS

| EP | 2048659 A1 | 4/2009 |
| EP | 2278356 A1 | 1/2011 |
| EP | 2592816 A1 | 5/2013 |
| WO | 0074350 A2 | 12/2000 |

OTHER PUBLICATIONS

Extended European Search Report, dated Dec. 14, 2015, issued in EP Application No. 15175391.0, tiled Jul. 6, 2015.

* cited by examiner

*Primary Examiner* — Andrew L Sniezek
(74) *Attorney, Agent, or Firm* — Perry + Currier, Inc.

(57) ABSTRACT

A communication device and method for adapting to audio accessories are provided. The communication device includes a memory; a first microphone, a connector for receiving data from an accessory device having a second microphone, and a processor interconnected with the memory, the microphone and the connector. The processor is configured to receive audio input and, when the audio input originated at the second microphone, to automatically apply equalization settings corresponding to the second microphone.

16 Claims, 5 Drawing Sheets

COMMUNICATION DEVICE AND METHOD FOR ADAPTING TO AUDIO ACCESSORIES

FIELD

The specification relates generally to communication devices, and specifically to a communication device and method for adapting to audio accessories.

BACKGROUND

Various accessories, such as microphone-equipped headsets, may be used with communication devices such as smart phones. The characteristics (e.g. frequency response and sensitivity) of such microphones may be widely variable, and thus the quality of sound generated by such microphones for transmission to other devices participating in voice calls may be unpredictable, and sometimes undesirably low.

BRIEF DESCRIPTIONS OF THE DRAWINGS

Embodiments are described with reference to the following figures, in which.

DETAILED DESCRIPTION OF THE EMBODIMENTS

According to aspects of the specification, a communication device is provided, including a memory; a first microphone, a connector for receiving data from an accessory device having a second microphone, and a processor interconnected with the memory, the microphone and the connector. The processor is configured to receive audio input and, when the audio input originated at the second microphone, to automatically apply equalization settings corresponding to the second microphone.

According to other aspects of the specification, a method is provided in a communication device having a processor, a memory, a first microphone and a connector. The method comprises: receiving audio input at the processor; determining whether the audio input originated at the first microphone or at a second microphone of an accessory device coupled to the processor via the connector; and when the audio input originated at the second microphone, automatically applying equalization settings corresponding to the second microphone.

According to further aspects of the specification, a non-transitory computer-readable medium is provided, storing a plurality of computer-readable instructions executable by a processor of a communication device having a memory, a first microphone and a connector coupled to the processor, for performing the above method.

Figure 1:
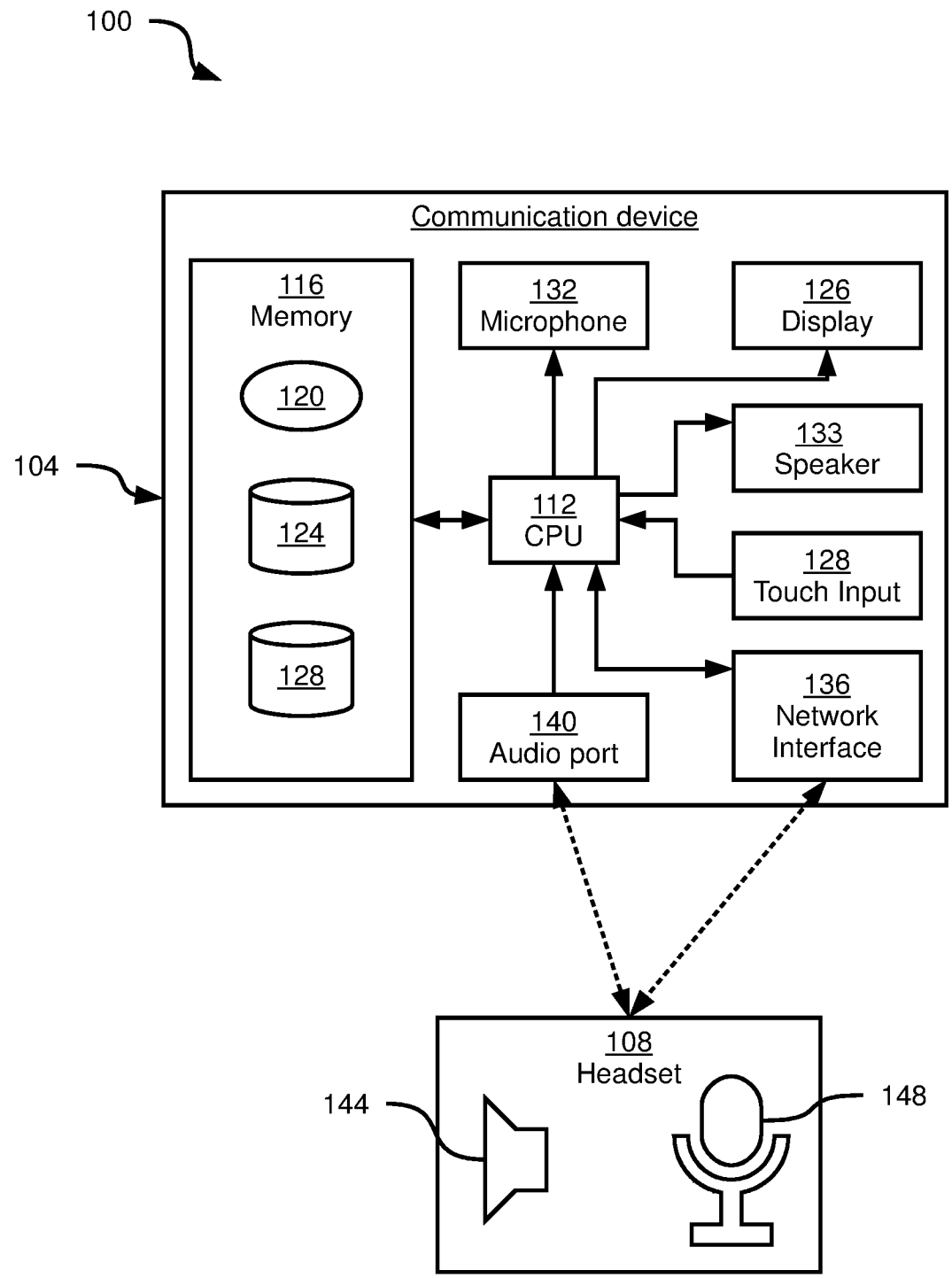
FIG. 1 depicts a system including a communication device capable of automatically adapting to characteristics of an accessory device, according to a non-limiting embodiment.

FIG. 1 depicts a system 100 including a communication device 104 and an accessory 108. Communication device 104 can be any one of a cellular phone, a smart phone, a tablet computer, a desktop computer and the like. More generally, communication device 104 is a computing device capable of conducting voice or video calls, and thus of receiving outgoing audio data for transmission to a called party, and of receiving and emitting incoming audio data from the called party. Accessory 108 can be coupled to communication device 104 to act as the collection point for the outgoing audio data and the emission point for the incoming audio data. Accessory 108 may be a headset, a combination of a boom microphone and speakers, an audio system comprising microphones and speakers in a vehicle, and the like. In the description below, accessory 108 may be referred to as headset 108 for illustrative purposes, though it will be understood that any references to a "headset" below may also be replaced with any other accessory device.

Before discussing the functionality of communication device 104 and headset 108 in greater detail, certain internal components of communication device 104 and headset 108 will be described.

Communication device 104 includes a central processing unit (CPU) 112, also referred to herein as a processor 112, interconnected with a computer readable storage medium such as a memory 116. Memory 116 can include any suitable combination of volatile memory (e.g. random access memory (RAM)) and non-volatile memory (e.g. read only memory (ROM), Electrically Erasable Programmable Read Only Memory (EEPROM), flash memory, magnetic hard disc, or optical disc).

Memory 116 stores computer readable instructions executable by processor 112, including a communications application 120 for managing voice calls, video calls and the like, also referred to herein as application 120. It is contemplated that other computer readable instructions can also be stored in memory 116, including an operating system. In the present example, memory 116 also stores at least one voice profile 124 and at least one accessory profile 128. The contents of profiles 124 and 128 will be discussed in greater detail below.

Processor 112 and memory 116 are generally comprised of one or more integrated circuits (ICs), and can have a variety of structures, as will now occur to those skilled in the art (for example, more than one CPU can be provided). Processor 112 executes the instructions of application 120 to perform, in conjunction with the other components of communication device 104, various functions related to participating in communication sessions such as voice or video calls with other communication devices, such as landline devices and the like. In the below discussion of those functions, communication device 104 is said to perform, or operate to perform, those functions. It will be understood that communication device 104 is configured to perform those functions via the processing of the computer readable instructions in memory 116 (including those of application 120) by the hardware components of mobile computing device 104 (including processor 112). More particularly, processor 112 can be said to operate to perform those functions by executing the instructions in memory 116.

Communication device 104, in the present example also includes a display 126 interconnected with processor 112. In other embodiments, display 126 may be omitted. Display 126 includes one or more display panels based on any suitable panel technology (e.g. liquid crystal display (LCD), organic light emitting diode (OLED), and the like), and receives data for presentation on such panels from processor 112. In addition, communication device 104 includes a touch input device 128 interconnected with processor 112, for receiving input (e.g. from an operator of communication device 104) and providing input representing such input to processor 112. Touch input device 128 can include any suitable combination of buttons and keypads, touch screens integrated with display 126, and the like.

Communication device 104 also includes a microphone 132 and speaker 133 interconnected with processor 112. Microphone 132 detects sound from the environment of communication device 104 and provides data representing such sound to processor 112. The data received at processor 112 from microphone 132 is referred to herein as "audio input" or more specifically as "handset audio input" (referring to the fact that microphone 132 is integrated within the housing, or handset, of communication device 104). Communication device 104 may also include other input devices, such as a camera, a GPS receiver, sensors such as light and motion sensors and the like. Such devices are not shown however, as they do not relate directly to the functionality of communication device 104 to be described herein.

Communication device 104 also includes a network interface 136 interconnected with processor 112, which allows communication device 104 to communicate with other devices over wired or wireless networks, including local-area and wide-area networks, for example to participate in the above-mentioned voice or video calls. Network interface 136 can also allow communication device 104 to communicate with accessory 108 over a short-range wireless link, such as a link based on the Bluetooth™ standard. Other wireless links, as well as wired links, are also contemplated. Network interface 136 thus includes the necessary hardware, such as radio transmitter/receiver units, network interface controllers and the like, to communicate over the above-mentioned links.

Communication device 104 can also include an audio port 140, such as a 3.5 mm port. Audio port 140 is dimensioned to receive a connector coupled to another device, such as accessory 108. Once such a device is connected to audio port 140, communication device 104 can send audio data to the other device and receive audio data from the other device. In the present example, audio port 140 sends and receives analog signals (with the necessary analog-to-digital and digital-to-analog being connected between audio port 140 and processor 112), although in other embodiments, audio port 140 may be configured to send and receive digital data. Thus, accessory 108, depending on its particular nature, may be connected to communication device via either network interface 136 or audio port 140. Network interface 136 and audio port 140 may be referred to generically as a connector.

The components of communication device 104 can be contained within a housing (not shown) comprising any suitable combination of materials (e.g. aluminum, plastics, and the like). The components of communication device 104 are interconnected via a communication bus (not shown). Communication device 104 can be powered by a battery (not shown) contained within the housing, though it will be understood that communication device 104 can also be supplied with electricity by a wired connection to a wall outlet or other power source, for example when docked. In other embodiments, where communication device 104 is in the form of a desktop computer for example, certain components need not be contained within the same housing, but can instead be contained in separate housings and connected together by wired or wireless connections.

Accessory 108 can include a processor, memory and network interface (not shown). In some embodiments, one or more of the processor, memory and network interface can be omitted from accessory 108 (that is, accessory 108 can be a passive device controlled directly by processor 112 of communication device 104). In addition, accessory 108 includes one or more output devices for media playback. Such devices can include displays, speakers and the like. In the present example, accessory 108 includes a speaker 144, which the processor of accessory 108 (or processor 112, when the accessory 108 is passive and lacks a separate processor) can control to play back audio data received from communication device 104. Accessory 108 also includes a microphone 148. Data representing sound detected by microphone 148 can be provided to communication device 104, for example via a wired connection between accessory 108 and audio port 140. Such data received at processor 112 is also referred to as "audio input" (as with the data received from microphone 132), and more specifically as "accessory audio input" (in contrast with the "handset audio input" mentioned above).

As mentioned above, accessory 108 can be any of a variety of types of devices, and there may exist a wide variety of devices within each type. For example, numerous models of headset exist that are connectable to communication device 104. Communication device 104 can therefore be paired with numerous accessory devices 108, each with different characteristics. The different characteristics of such accessory devices 108 can include differences in the sensitivity and frequency response of microphone 148, such that the voice of the same operator of communication device 104 may be represented differently by one microphone 148 than by another microphone 148. As will be described below in greater detail, communication device 104 is configured to automatically detect and adapt to the different frequency responses of microphones 148.

Figure 2:
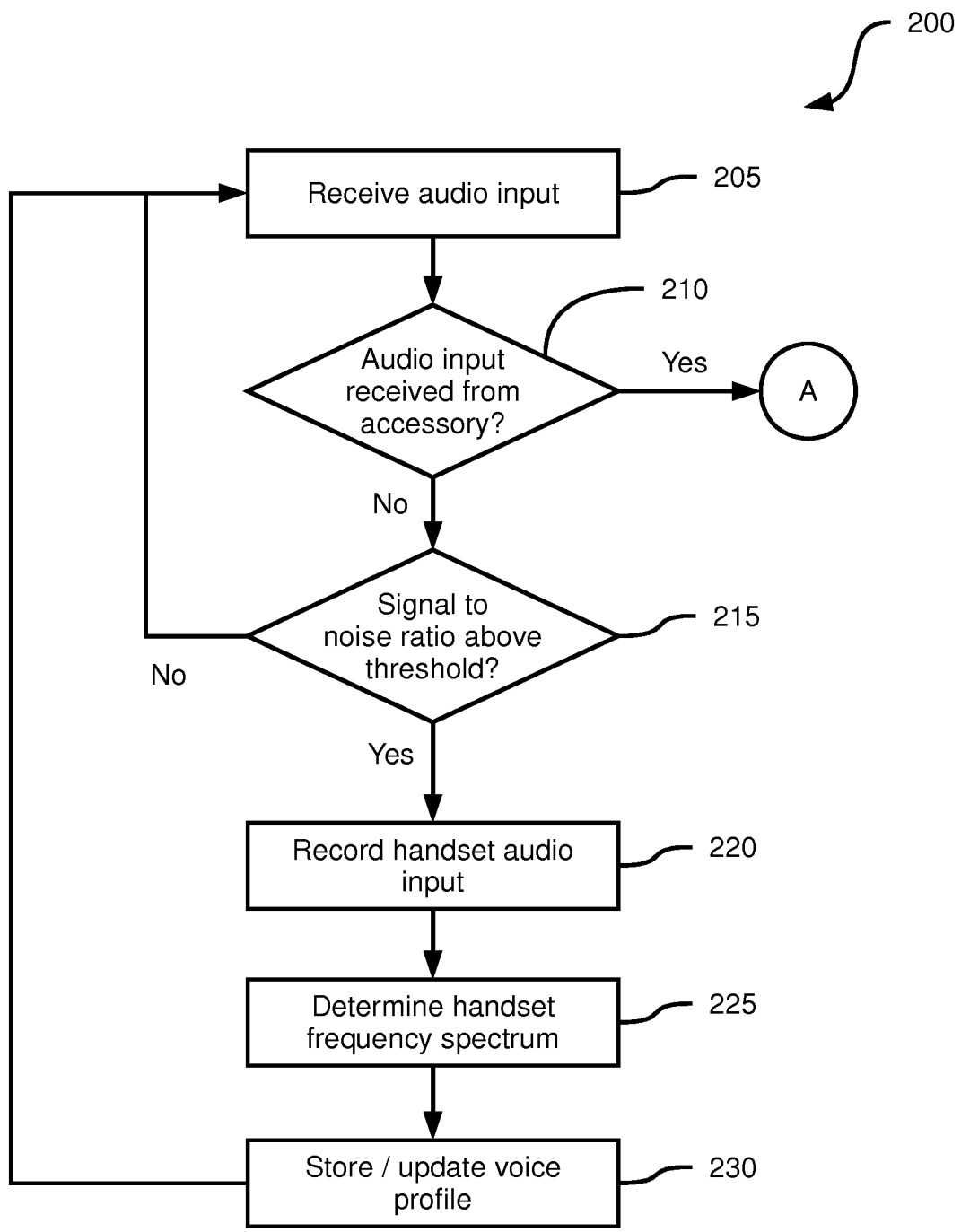
FIG. 2 depicts a method of updating a voice profile in the system of FIG. 1, according to a non-limiting embodiment.
Figure 3:
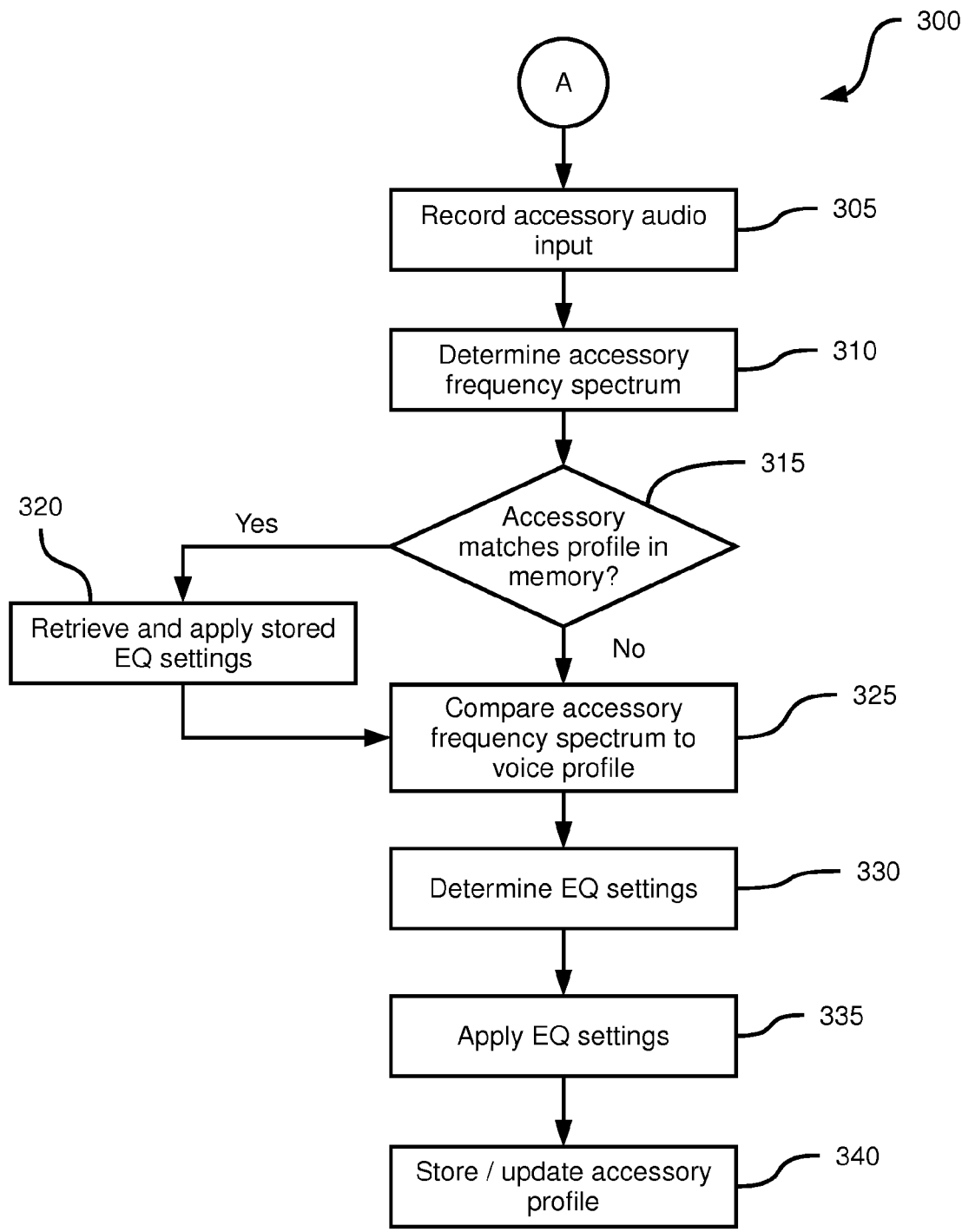
FIG. 3 depicts a method of updating an accessory profile in the system of FIG. 1, according to a non-limiting embodiment.

Referring now to FIGS. 2 and 3, a method of automatically adapting operational parameters in communication device 104 to accessory device 108 will be described. For ease of illustration, the method is depicted in two portions—a method 200 of updating a voice profile corresponding to an operator of communication device 104, and a method 300 of adapting to accessory device 108 based on the voice profile.

Referring in particular to FIG. 2, communication device 104 performs method 200 beginning with block 205. At block 205, processor 112 is configured to receive audio input (that is, audio data received from a microphone, whether from microphone 132 or from microphone 148 via one of network interface 136 and audio port 140). In some examples, communication device 104 operates to first determine whether a call is in progress via the execution of application 120 before performing block 205. In other words, communication device 104 can restrict the performance of method 200 to only instances when communication device 104 is participating in a call with another device. Such restriction may increase the likelihood that the audio input detected at block 205 represents the voice of the operator of communication device 104.

Having received audio input at block 205, at block 210 communication device can operate to determine whether the audio input received at block 205 was received from accessory 108 or "locally" (that is, from microphone 132). The nature of the determination at block 210 is not particularly limited. For example, the audio data received at processor 112 may be accompanied by an identifier of microphone 132 or accessory 108. In other examples, the audio data may be accompanied by identifiers of other hardware elements within communication device 104, such as an identifier of audio port 140 or an identifier of a sound processor that receives input from microphone 132. When the determination at block 210 is affirmative, communication device 104 is configured to perform method 300, to be discussed below. When the determination at block 210 is negative, however (that is, when the audio input is handset audio input received from microphone 132), communication device 104 proceeds to block 215.

At block 215, communication device 104 can be configured to determine whether a ratio of voice to background noise (also referred to as the signal to noise ration) is above a predetermined threshold. Various mechanisms will now occur to those skilled in the art for distinguishing background audio (noise) from other data (signal) in the received audio data, such as the voice of an operator of communication device 104. Processor 112 can determine the ratio (for example, in decibels), and compare the ratio to a predetermined ratio stored in memory 116. If the ratio is below the threshold, the performance of method 200 can return to block 205, as the subsequent steps in method 200 may be negatively affected by elevated levels of background noise. In some examples, however, block 215 may be omitted. When the determination is affirmative (that is, when the ratio is above the threshold), performance of method 200 proceeds to block 220.

At block 220, communication device 104 is configured to record the audio input received at block 205 (referred to as handset audio input due to its origin at microphone 132), by storing the audio input in memory 116. The audio input stored at block 220 may be stored in any suitable format. Suitable formats include the WAV file format and the MP3 file format. More generally, the audio input can be stored as a series of values each representing a microphone voltage at a given sample time. The WAV format, merely by way of non-limiting example, generally records 44100 samples per second, with each sample representing the signal with 16 bits. A wide variety of other sampling rates and bit depths are contemplated however. Sample rates at block 220 can include 8 kHz, 16 kHz, 24 kHz, 32 kHz and 48 kHz, by way of non-limiting examples. Other bit depths can also be used at block 220, including but not limited to 24 bits. Processor 112 can be configured to convert the audio input into data representing the frequency and amplitude (i.e. volume) of the sound that was detected by microphone 132. In other examples, such conversion may be performed before storage, and the audio input can be stored in the form of a series of frequency and volume values.

At block 225, communication device 104 is configured to determine the frequency spectrum, also referred to as a sound spectrum, of the audio input stored at block 220. The frequency spectrum includes indications, for a range of frequencies, of the strength (e.g. amplitude) of each frequency. The frequency spectrum can be determined according to any suitable known method. For example, processor 112 can be configured to perform a Fast Fourier Transform (FFT) on the audio input to determine the frequency spectrum. The frequency spectrum may be determined for any suitable length of time. For example, the performance of block 225 may be delayed until completion of the call during which the audio input is being received. In other examples, an updated frequency spectrum can be determined during the receipt of audio input, at a configurable interval (e.g. every five seconds).

Figure 4:
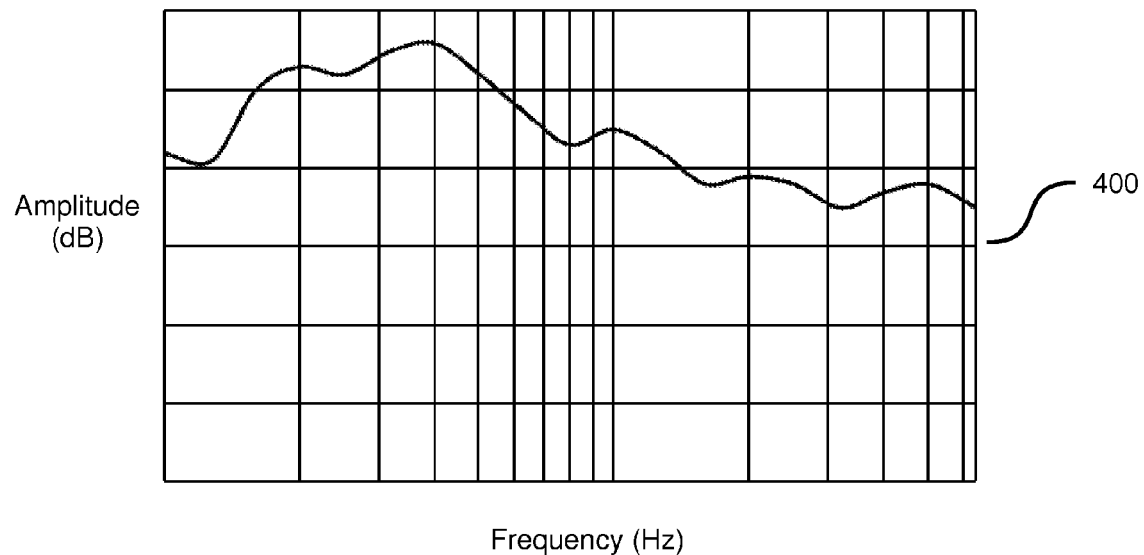
FIG. 4 depicts example frequency spectra generated in the performance of the methods of FIGS. 2 and 3, according to a non-limiting embodiment.
Figure 4:
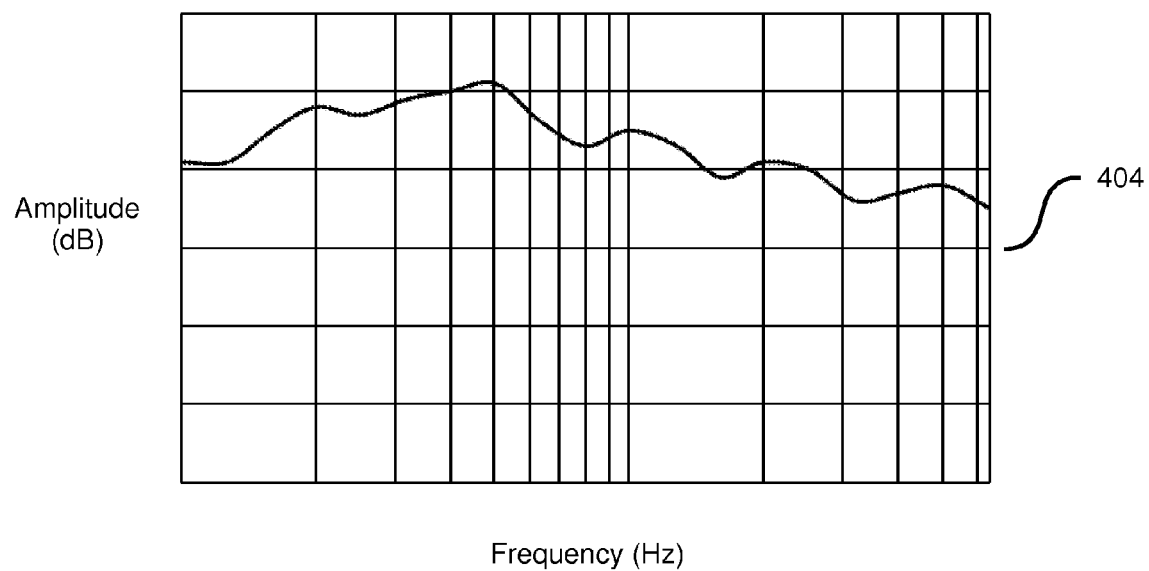

Turning briefly to FIG. 4, a spectrum 400 is shown, resulting from the performance of block 225 of method 200.

Although spectrum 400 is represented graphically in FIG. 4, communication device 104 can determine and store the spectrum in a wide variety of formats, including a table, database, flat file and the like.

Returning to FIG. 2, after determining the spectrum, at block 230 communication device 104 is configured to update voice profile 124. Specifically, the spectrum determined at block 225 is stored within voice profile 124. Subsequent performances of method 200 (whether during the same call, or in subsequent calls or other operations) can result in the spectrum stored in voice profile 124 being updated further. As a larger number of performances of method 200 are conducted by communication device 104, recording and analysing the voice of the same operator via microphone 132, the accuracy of the spectrum in voice profile 124 may be increased.

Referring now to FIG. 3, as mentioned above, when the audio input received at block 205 is received from accessory 108 rather than from microphone 132, the determination at block 210 leads to block 305 of method 300 rather than to block 215. At block 305, communication device 104 is configured to record the audio input received from accessory 108 (more specifically, from microphone 148). The recording of the audio input is conducted as described above in conjunction with block 220 of method 200.

Communication device 104 is then configured, at block 310, to determine the frequency spectrum of the audio input recorded at block 310. The determination of frequency spectrum may be performed as described above in conjunction with block 225. Referring again to FIG. 4, a second spectrum 404 is shown (again in graphical form, although it need not be generated or stored in graphical form). It is assumed in the performance of methods 200 and 300 described herein that the audio input is representative of the voice of the same operator. However, as seen in FIG. 4, spectrum 400 differs from spectrum 404. The differences between spectra 400 and 404 may be partly or entirely accounted for by differences in the frequency response and sensitivity of microphone 132 in comparison with microphone 148.

Returning to FIG. 3, communication device 104 is configured to determine whether accessory 108, from which the audio input was received at block 205, matches accessory profile 128 in memory 116. The determination at block 310 can take various forms. In some examples, in which accessory 108 connects with communication device 104 via a wireless connection such as Bluetooth™, the audio input received at block 310 may be accompanied by, or preceded by, an identifier of accessory 108 (e.g. a Media Access Control, MAC, address). Each accessory profile 128 in memory 116 may include an identifier of the corresponding accessory, and the determination at block 315 may therefore be a determination of whether the accessory identifier received at block 205 exists in any accessory profile 128.

In other examples, where accessory 108 is connected to communication device 104 via audio port 140, it may not be possible for communication device 104 to receive an explicit identifier such as a MAC address. In such examples, the determination at block 315 can be a determination of whether the spectrum determined at block 310 matches (to within a predefined tolerance) a spectrum stored in accessory profile 128.

If the determination at block 315 is affirmative, the performance of method 300 proceeds to block 320, which will be described in greater detail below. However, if the determination at block 315 is negative, the performance of method 300 proceeds to block 325. At block 325, communication device 104 is configured to compare the spectrum stored in voice profile 124 with the spectrum determined at block 310. In the present example, therefore, at block 325 communication device compares spectra 400 and 404, as shown in FIG. 4.

Based on the comparison at block 325, communication device 104 is configured at block 330 to determine equalization settings for accessory 108. Equalization settings comprise at least one value representing an adjustment to a frequency component of a signal. Communication device 104 is configured at block 330 to select equalization settings that, when applied to the spectrum determined at block 310 to generate a modified spectrum, cause that modified spectrum to match the spectrum of voice profile 124. In other words, based on the assumption that spectra 400 and 404 represent the voice of the same operator and that differences between spectra 400 and 404 are therefore caused at least partly by differences between microphone 132 and microphone 148, communication device 104 determines values by which to adjust future audio input from accessory 108 so that such future audio input yields a spectrum that matches the spectrum of voice profile 124.

Any suitable computation may be applied by communication device 104 to determine equalization settings. In some examples, communication device 104 may divide the amplitude of a frequency band from the spectrum in voice profile 124 by the amplitude for the same frequency band in the spectrum determined at block 315, and use the resulting value as an equalization setting for that frequency band. This operation may be repeated for any other frequency bands appearing in the spectra.

Having determined equalization settings at block 330, communication device 104 is configured at block 335 to apply the equalization settings to subsequent audio input from accessory 108 (which continues to be received from accessory 108). The application of equalization settings to audio input is well understood by those skilled in the art. By applying the equalization settings to the audio input, communication device 104 can adjust, or transform, the audio input before the audio input is played back at a downstream apparatus such as a speaker of another communication device participating in a call with communication device 104. The downstream apparatus need not be another device participating in a call. In some examples, the downstream apparatus can be speaker 144; in still other examples, the subsequent audio need not be played back at any downstream apparatus. Instead, the subsequent audio can be processed by processor 112 via the execution of a voice recognition application or a dictation application. In general, at block 335 the equalization settings are applied to the subsequent audio before further processing of the subsequent audio.

Figure 5:
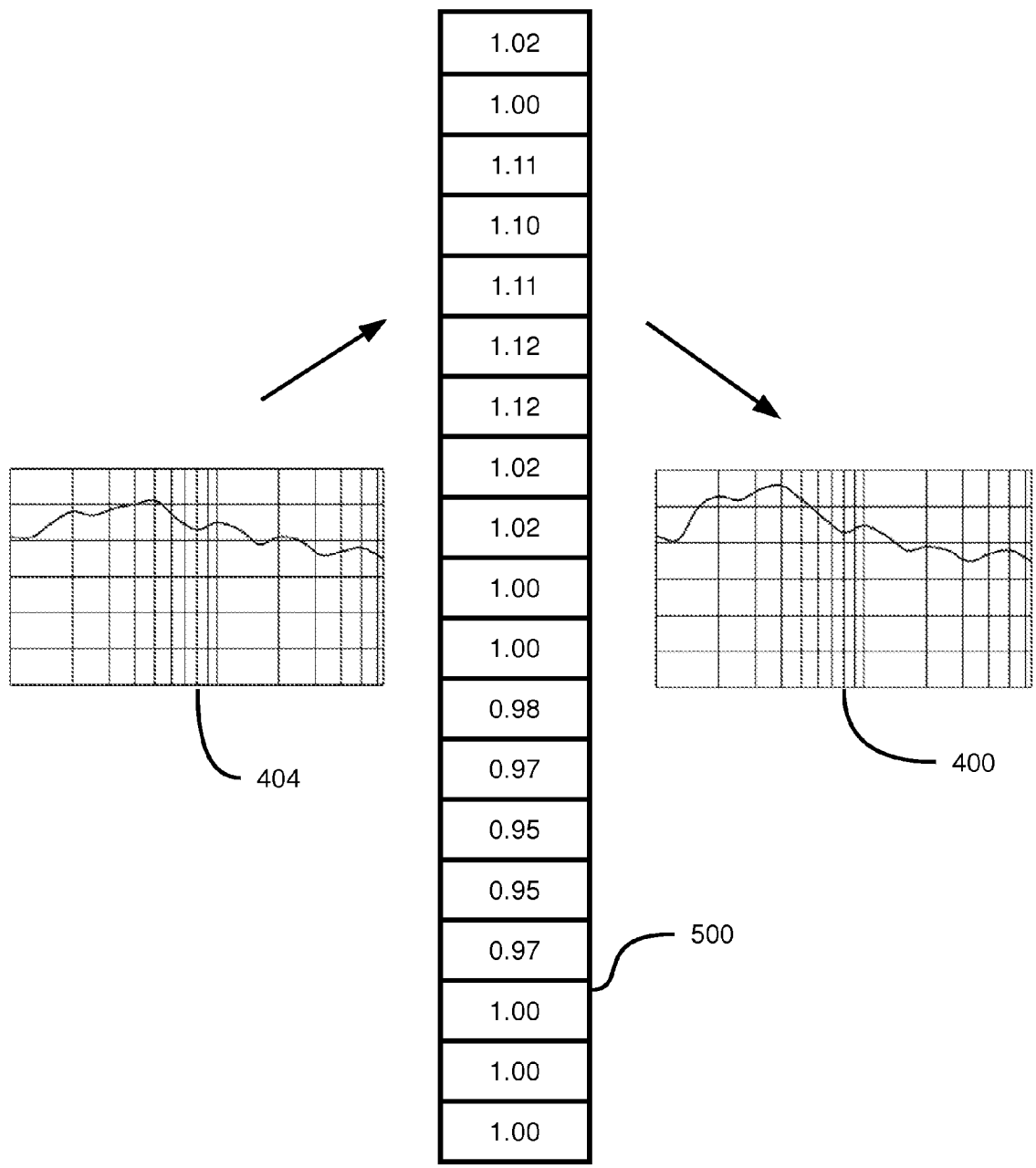
FIG. 5 depicts equalization settings determined during the performance of the method of FIG. 3, according to a non-limiting embodiment.

At block 340, communication device 104 is also configured to store the equalization settings determined at block 330 in accessory profile 128. If an accessory profile for accessory 108 did not previously exist, communication device 104 creates accessory profile 128 at block 340. An example of stored equalization settings 500 is shown in FIG. 5. The tabular format shown in FIG. 5 is for the purpose of illustration—any suitable format may be used. As seen in FIG. 5, equalization settings 500 contain a plurality of adjustment values, one for each frequency band present in spectra 400 and 404. When applied to spectrum 404, equalization settings 500 transform spectrum 404 into spectrum 400. In other words, when the operator's voice is received at communication device 104 from microphone 148, the application of equalization settings 500 to the audio input from accessory 108 will transform the audio input to give the audio input the appearance of having been received from microphone 132.

Returning to FIG. 3, in a subsequent performance of method 300, the determination at block 315 may be affirmative. For example, the spectrum determined at block 310 may be determined by processor 112 to match spectrum 404, which is now stored in accessory profile 128. At block 320, communication device 104 is configured to retrieve equalization settings 500 from accessory profile 128 and to apply those settings to subsequent audio input received from accessory 108. Communication device 104 can then proceed to block 325, as described above. The performance of blocks 325 to 340, when equalization settings already exist for accessory 108, can serve to update or refine those equalization settings.

In some embodiments, after the equalization settings have been updated for a specific accessory profile 128 a predefined number of times, or when updates to the equalization settings make no changes (or only changes below a predefined threshold) to the equalization settings, blocks 325 to 340 can be omitted for that particular accessory. The number of updates, or the magnitude of the most recent update, may be stored in accessory profile 128. Thus, equalization settings in any given accessory profile 128 may experience greater variation immediately following the creation of accessory profile 128, and may converge over time on a final set of equalization settings.

As will now be apparent to those skilled in the art, the generation and storage of a different set of equalization settings for each accessory 108 can allow communication device 104 to adjust audio input received from such accessories so that to the party receiving the adjusted audio input (such as the other party in a call with the operator of communication device 104), the audio input is perceived as having substantially the same quality from all microphones, including microphone 132 and accessory microphones, such as microphone 148. The use of audio input from microphone 132 as a reference to which other audio input is matched by the use of equalization settings is not mandatory (for example, a different microphone may be used as the "reference" to build voice profile 124 in method 200), but may be preferable as the position of the operator in relation to microphone 132 is more likely to be consistent between uses (as the operator will generally hold communication device 104 against the side of their head) than the position of the operator in relation to, for example, a boom microphone or headset not physically fixed to communication device 104.

Variations to the above are contemplated. For example, it is not necessary for the blocks of methods 200 and 300 to be performed in the exact sequence shown in FIGS. 2 and 3. In some embodiments, block 315 may be performed before block 310, or both before (to check for explicit identifiers) and after (to check for matching spectra).

It is also contemplated that throughout the performances of methods 200 and 300, the audio input received at block 205 may be processed in other ways while methods 200 and 300 are being performed. For example, it is not necessary to wait for the operations associated with blocks 310-340 to be completed before passing audio input to network interface 136 for transmission to a called party. In other words, portions of methods 200 and 300 may be performed in parallel with other operations on communication device 104. Methods 200 and 300 also need not be performed on all audio input received at processor 112. For example, during a call, communication device can be configured to perform methods 200 and 300 on audio input once every thirty seconds, analyzing ten seconds of audio input on each performance. The above durations may be varied, and may also be configurable within communication device 104.

In further examples, communication device 104 can be configured to apply limits, filters or both to the determination of equalizer settings at block 330. For example, processor 112 can limit an equalization setting for any given frequency band to a predefined maximum value, to reduce or eliminate signal clipping. Thus, if microphone 148 has low sensitivity which would ordinarily lead to the selection of a high equalization setting for one or more frequency bands (to prevent the audio input from microphone 148 from sounding undesirably quiet), limits may be applied to the equalization settings to prevent distortion or undesirable amplification of ambient noise.

Persons skilled in the art will appreciate that there are yet more alternative implementations and modifications possible for implementing the embodiments, and that the above implementations and examples are only illustrations of one or more embodiments. The scope, therefore, is only to be limited by the claims appended hereto.

We claim:
1. A communication device, comprising:
  a first microphone:
  a memory;
  a connector for receiving data from an accessory device having a second microphone; and
  a processor interconnected with the memory, the first microphone and the connector, the processor configured to:
    determine a first frequency spectrum by receiving respective audio input using the first microphone;
    store the first frequency spectrum in the memory;
    receive audio input from the second microphone;
    generate a second frequency spectrum of the second microphone based on the audio input therefrom;
    based on a comparison between the second frequency spectrum and the first frequency spectrum, select equalization settings that, when applied to second frequency spectrum of the second microphone will generate a modified spectrum that matches the first frequency spectrum of the first microphone;
    automatically apply the equalization settings to subsequent audio input from the second microphone;
    provide the subsequent audio input to a downstream apparatus after the equalization settings have been automatically applied thereto;
    receive further audio input from one or more of the first microphone and the second microphone to update one or more of the first frequency spectrum and the second frequency spectrum; and,
    refine the equalization settings based on one or more of an updated first frequency spectrum and an updated second frequency spectrum.
2. The communication device of claim 1, the processor further configured to:
  store the equalization settings in the memory in an accessory profile corresponding to the second microphone.
3. The communication device of claim 1, wherein the equalization settings comprise at least one gain value corresponding to at least one frequency band; the processor further configured to generate the equalization settings by selecting the at least one gain value based on the difference between an amplitude of the at least one frequency band in the first frequency spectrum and an amplitude of the at least one frequency band in the second frequency spectrum.

4. The communication device of claim 1, the processor further configured to determine whether the audio input originated at the second microphone, prior to applying the equalization settings.
5. The communication device of claim 1, wherein the further audio input is received during a call, and the equalization settings are refined during the call.
6. The communication device of claim 1, wherein the first frequency spectrum corresponds to a voice profile of an operator of the communication device.
7. A method comprising:
  at a device comprising: a first microphone; a memory; and a processor interconnected with the memory, the first microphone and the connector, determining, at the processor, a first frequency spectrum by receiving respective audio input using the first microphone;
  storing the first frequency spectrum in the memory;
  receiving, at the processor, audio input from the second microphone;
  generating, at the processor, a second frequency spectrum of the second microphone based on the audio input therefrom;
  based on a comparison between the second frequency spectrum and the first frequency spectrum, selecting, at the processor, equalization settings that, when applied to second frequency spectrum of the second microphone will generate a modified spectrum that matches the first frequency spectrum of the first microphone;
  automatically applying, at the processor, the equalization settings corresponding to subsequent audio input from the second microphone;
  providing, at the processor, the subsequent audio input to a downstream apparatus after the equalization settings have been automatically applied thereto;
  receive further audio input from one or more of the first microphone and the second microphone to update one or more of the first frequency spectrum and the second frequency spectrum; and,
  refine the equalization settings based on one or more of an updated first frequency spectrum and on updated second frequency spectrum.
8. The method of claim 7, further comprising:
  storing the equalization settings in the memory in an accessory profile corresponding to the second microphone.
9. The method of claim 7, wherein the equalization settings comprise at least one gain value corresponding to at least one frequency band; the method further comprising:
  generating the equalization settings by selecting the at least one gain value based on the difference between an amplitude of the at least one frequency band in the first frequency spectrum and an amplitude of the at least one frequency band in the second frequency spectrum.
10. The method of claim 7, wherein the further audio input is received during a call, and the equalization settings are refined during the call.
11. The method of claim 7, wherein the first frequency spectrum corresponds to a voice profile of an operator of the communication device.
12. A non-transitory computer-readable medium storing a computer program, wherein execution of the computer program is for:
  at a device comprising: a first microphone; a memory; and a processor interconnected with the memory, the first microphone and the connector, determining, at the processor, a first frequency spectrum by receiving respective audio input using the first microphone;

storing the first frequency spectrum in the memory;
receiving, at the processor, audio input from the second microphone;
generating, at the processor, a second frequency spectrum of the second microphone based on the audio input therefrom;
based on a comparison between the second frequency spectrum and the first frequency spectrum, selecting, at the processor, equalization settings that, when applied to second frequency spectrum of the second microphone will generate a modified spectrum that matches the first frequency spectrum of the first microphone;
automatically applying, at the processor, the equalization settings corresponding to subsequent audio input from the second microphone;
providing, at the processor, the subsequent audio input to a downstream apparatus after the equalization settings have been automatically applied thereto;
receive further audio input from one or more of the first microphone and the second microphone to update one or more of the first frequency spectrum and the second frequency spectrum; and;
refine the equalization settings based on one or more of an updated first frequency spectrum and an updated second frequency spectrum.

13. The non-transitory computer-readable medium of claim 12, wherein execution of then computer program is further for:
storing the equalization settings in the memory in an accessory profile corresponding to the second microphone.

14. The non-transitory computer-readable medium of claim 12, wherein the equalization settings comprise at least one gain value corresponding to at least one frequency band; and execution of then computer program is further for:
generating the equalization settings by selecting the at least one gain value based on the difference between an amplitude of the at least one frequency band in the first frequency spectrum and an amplitude of the at least one frequency band in the second frequency spectrum.

15. The non-transitory computer-readable medium of claim 12, wherein the further audio input is received during a call, and the equalization settings are refined during the call.

16. The non-transitory computer-readable medium of claim 12, wherein the first frequency spectrum corresponds to a voice profile of an operator of the communication device.

* * * * *